United States Patent
Luque Lopez

(10) Patent No.: US 11,942,562 B2
(45) Date of Patent: Mar. 26, 2024

(54) THERMO-PHOTOVOLTAIC CELL AND METHOD OF MANUFACTURING SAME

(71) Applicant: SILBAT ENERGY STORAGE SOLUTIONS, S.L., Madrid (ES)

(72) Inventor: Antonio Ignacio Luque Lopez, Madrid (ES)

(73) Assignee: SILBAT ENERGY STORAGE SOLUTIONS, S.L., Madrid (ES)

( * ) Notice: Subject to any disclaimer, the term of this patent is extended or adjusted under 35 U.S.C. 154(b) by 86 days.

(21) Appl. No.: 17/640,228

(22) PCT Filed: Sep. 3, 2020

(86) PCT No.: PCT/EP2020/074632
§ 371 (c)(1),
(2) Date: Mar. 3, 2022

(87) PCT Pub. No.: WO2021/043918
PCT Pub. Date: Mar. 11, 2021

(65) Prior Publication Data
US 2022/0328701 A1    Oct. 13, 2022

(30) Foreign Application Priority Data
Sep. 3, 2019    (EP) .................................... 19382747

(51) Int. Cl.
*H01L 31/02* (2006.01)
*H01L 31/0224* (2006.01)
(Continued)

(52) U.S. Cl.
CPC .. *H01L 31/0201* (2013.01); *H01L 31/022433* (2013.01); *H01L 31/056* (2014.12); *H01L 31/1804* (2013.01); *H02S 10/30* (2014.12)

(58) Field of Classification Search
CPC ............... H01L 31/0201; H01L 31/056; H01L 31/022433; H01L 31/1804; H02S 10/30
See application file for complete search history.

(56) References Cited

U.S. PATENT DOCUMENTS 9,461,191 B2  10/2016  Wernsman et al.
9,929,296 B1 *  3/2018  Rose .................... H01L 31/0352
(Continued)

FOREIGN PATENT DOCUMENTS

EP    3120096 B1    6/2018
WO    2004/019419 A2    3/2004

OTHER PUBLICATIONS

Born, M. et al.: Principles of Optics, Pergamon Press, Oxford (1975).
(Continued)

*Primary Examiner* — Jayne L Mershon
(74) *Attorney, Agent, or Firm* — Kramer & Amado, P.C.

(57) ABSTRACT

The present invention belongs to the field of photovoltaic cells and relates to a thermo-photovoltaic cell able of converting into electric power the practical totality of the radiant power emitted from an incandescent source and absorbed by the thermo-photovoltaic cell and returning to the incandescent source a large amount of the non absorbed radiation by means of a mirror. The invention also relates to a module comprising such a thermo-photovoltaic cell and a method of manufacturing such a thermo-photovoltaic cell.

22 Claims, 8 Drawing Sheets

(51) Int. Cl.
     *H01L 31/056*     (2014.01)
     *H01L 31/18*      (2006.01)
     *H02S 10/20*      (2014.01)
     *H02S 10/30*      (2014.01)

(56) References Cited

U.S. PATENT DOCUMENTS

2006/0107995 A1*   5/2006   Kovacik .................. H02S 10/30
                                                                                   136/253
2019/0036473 A1*   1/2019   Sablon .................... G02B 1/005

OTHER PUBLICATIONS

Datas et al.: Ultra high temperature latent heat energy storage and thermophotovoltaic energy conversion, Energy 107, 542-549 (2016).
Luque, A.: Coupling Light to Solar Cells. Prince, M. (ed.) Advances in Solar Energy. vol. 8, pp. 161-230. ASES, Boulder (CO) (1993).
Luque, A.: The Confinement of Light in Solar-Cells, Solar Energy Materials 23(2-4), 152-163 (1991).
Luque, A.: Solar Cells and Optics for Photovoltaic Concentration, Adam Hilger, Bristol (1989), Chaps. 4 and 14.
Shockley, W.: The Theory of p-n junctions in Semiconductors and p-n Junction Transistors, Bell Syst. Tech. J. 28, 435-489 (1949).
Yablonovitch, E., Cody, G.D.: Intensity enhancement in textured optical sheets for solar cells. Electron Devices, IEEE Transactions, 29(2), 300-305 (1982).

\* cited by examiner

THERMO-PHOTOVOLTAIC CELL AND METHOD OF MANUFACTURING SAME

TECHNICAL FIELD OF THE INVENTION

The present invention belongs to the field of photovoltaic cells and relates to a thermo-photovoltaic cell able of converting into electric power the radiant power emitted by an incandescent source present in an incandescent chamber and of returning to the incandescent source a large amount of the unused radiation.

BACKGROUND OF THE INVENTION

Semiconductors have a transparency or absorption threshold of electromagnetic radiation at a certain wavelength, above which they are essentially transparent to radiation. Below the transparency threshold, the radiation is absorbed, usually with generation of photocurrent. Each semiconductor material has a different transparency threshold.

The photovoltaic (PV) cells are based on semiconductor plates inside which at least one pn junction has been formed, usually parallel to the surfaces of the plate. Sometimes the plate includes a stack of several different semiconductors and several junctions formed therein. In that case, the transparency threshold is that of the semiconductor with the highest transparency threshold.

After forming the junctions, the generated current must be extracted. To do this, the photovoltaic cell is post-processed by depositing electric conductors on both faces of the photovoltaic cell. On the back face it is often a simple metal sheet but on the front face it is necessary to deposit a metal grid that permits an extraction of the photocurrent while allowing the light to pass into the semiconductor so that photocurrent is produced at a certain voltage. That is, the photovoltaic cells produce electric power out from radiation power.

The mentioned post-processing consists in depositing grid shaped electrodes to extract the current from the semiconductor plate. This is a common practice in solar cells and where a certain tradeoff is to be found between a dense metal grid, with small Joule (or series resistance) losses but very shading, and a light grid, very transparent but with more Joule losses. In PV, almost any planar (contained in a plane) reasonable structure leads to very similar results.

In ordinary photovoltaic cells, an optimization of the grid shading is usually done. It is based on a balance between the grid shading and the losses due to Joule effect of the electric current. These losses are determined as $I^2 \cdot R_s$, $I$ being the current and $R_s$ being the series resistance whose calculation is explained, for example, in Luque, A.: *Solar Cells and Optics for Photovoltaic Concentration*, Adam Hilger, Bristol (1989), Chap. 4. Due to the distributed character of the currents, for a correctly designed photovoltaic cell, the series resistance is about $R_s \approx \frac{1}{3} R_g$, $R_g$ being the geometric resistance, $R_g = \rho_\Omega \cdot L/A$, wherein $\rho_\Omega$ is the resistivity, $L$ is the length and $A$ is the area, but in some cases the current is not distributed, as e.g. the current going from the front to the back of the cell. In the design of photovoltaic cells the so-called specific series resistance ($r_{ss}$), is often used, wherein $r_{ss} = R_s \cdot A'$, $A'$ being the area of the fraction of cell from which the current is collected.

In summary, a shading/Joule-loss tradeoff is usually sought in the design of ordinary PV cells.

The thermo-photovoltaic (TPV) effect is related to the use of a photovoltaic cell to extract electric power from an incandescent radiation source situated nearby. It consists in returning to the incandescent source as much as possible of the radiation received, primarily radiation above the transparency threshold, with the purpose of keeping the source hot. The efficiency of a photovoltaic cell ($\eta_{PV}$) is defined as $\eta_{PV} = P_{e,max}/P_i$, $P_{e,max}$ being the maximum extractable electrical power and $P_i$ being the incident radiant power. In a thermo-photovoltaic rig or TPV device the efficiency is defined as $\eta_{TPV} = P_{e,max}/(P_i - P_r)$, $P_{e,max}$ being the maximum extractable electrical power, $P_i$ being the incident radiant power and $P_r$ being the radiant power returned to the radiation source. Theoretically, $\eta_{TPV}$ could even reach the Carnot efficiency between the incandescent body and the cell absolute temperatures. In practice we are very far of achieving this efficiency.

Despite the precise definition given above it is very common to call thermo-photovoltaic cell a photovoltaic cell well adapted to the spectrum of said incandescent source, even if no radiation is returned to the source or if it is insignificant. In practice there is no photovoltaic (PV) cell, even if called thermo-photovoltaic (TPV), which returns to the source substantially the non-absorbed light emitted by said source.

Document EP3120096B1 discloses a system for storing energy obtained from ordinary electric power, or from other sources, in silicon or other material, melting it so that it becomes incandescent, and recovering this energy from the power radiated in the form of electric power by means of photovoltaic cells. Nothing is said in document EP3120096B1 concerning how the cells are.

Document WO2004019419A2 discloses the placement of a filter between the PV device and the incandescent source with the purpose of reflecting back to the source some radiation beyond the transparency threshold of the PV device. However, there are some drawbacks in the solution proposed by WO2004019419A2. First, the reflection of the filter covers a small wavelength span. Also, it has a deleterious reflection coefficient below the transparency threshold.

Document U.S. Pat. No. 9,461,191B2 discloses the use of a back mirror. In particular the mirror is made with a layer of gold stuck to a specific substrate with an organic binder to avoid the use of transition metal for it that will damage the gold reflectance. Except for the binder this is not different to previous art. However, this close contact of the gold with the semiconductor will cause serious photon absorption and reduce the thermo-photovoltaic efficiency.

Patent US2019/036473A1 discloses a PV cell intended to capture the illumination created by the radiative recombination, with a selective filter and a back mirror. The weak illumination created by the radiative recombination is very different to the illumination management intended in the TPV effect.

In Datas et al.: Ultra high temperature latent heat energy storage and thermophotovoltaic energy conversion, Energy 107, 542-549 (2016) a system with thermo-photovoltaic cells introduced in a tube located inside a vessel of molten silicon is disclosed. However, no details are given about the thermo-photovoltaic cells. In this paper to achieve radiation recycling, a bifacial cell structure compatible with an effective transparent system of water cooling is disclosed. In this configuration it is doubtful that the cooling proposed may be effective.

The purpose of the present invention is to disclose a configuration that collects almost the totality of the radiation flux emitted by an incandescent body, reduces greatly the Joule losses for extracting the current and returns to the incandescent body a big fraction of the non-absorbable incident radiation.

SUMMARY OF THE INVENTION

The present invention discloses a more efficient thermo-photovoltaic cell adapted to return to a nearby located incandescent radiation source most of the photons whose energy is not sufficient for producing photocurrent in order to keep the source hot as well as the radiation reflected by the thick grid needed to reduce the Joule losses caused by the proximity of the hot source. As explained below, the TPV efficiency of the thermo-photovoltaic cell of the present invention is considered as a high efficiency.

For it, a thermo-photovoltaic cell according to claim 1, a module according to claim 14, an energy storage system according to claim 17 and a method of manufacturing a thermo-photovoltaic cell according to claim 18 are disclosed. In the dependent claims, preferred embodiments of the invention are defined.

In a first inventive aspect a thermo-photovoltaic cell is provided comprising:
- a semiconductor plate having a front face and a back face, the semiconductor plate comprising at least one pn junction or one np junction or one heterojunction,
- a plurality of front contact-finger strips placed on the front face, the front contact-finger strips being electrically conductive and making electrical contact with the front face of the semiconductor plate,
- at least one electrically conductive front busbar-base strip placed on the front face and at least one electrically conductive wire placed on a corresponding front busbar-base strip and electrically contacting with it, the front busbar-base strip and the at least one electrically conductive wire intersecting the front contact-finger strips, and
- an electrically conductive layer, arranged at the back face, wherein the electrically conductive layer and the back face make electrical contact only at localized electrically conductive strips, either directly or through an intermediate electrically conductive material.

Contact-finger strips should be understood throughout this document as narrow highly conductive strips, usually metallic, which are intended to contact the semiconductor plate.

The front busbar-base strip together with the electrically conductive wires form a three-dimensional front busbar.

In contrast to the cell disclosed in Document U.S. Pat. No. 9,461,191B2, in the present invention the electrically conductive layer and the back face make electrical contact only at localized electrically conductive strips, so preventing an extended contact between the back face and the electrically conductive layer. Therefore, the efficiency reduction is avoided given that the electrically conductive strips occupy a very small fraction of the back surface of the cell. Accordingly, in the present invention efficiency about 50% higher than that announced in Document U.S. Pat. No. 9,461,191B2 may be reached.

In a preferred embodiment the semiconductor plate is rectangular and, preferably, of sub-millimetre thickness.

In a preferred embodiment, the area of the rectangular semiconductor plate is preferably of 6×2 cm$^2$.

The TPV cell of the first inventive aspect considers not only the shading/Joule-loss but also the radiation return. Thus the tradeoff will be shading/Joule-loss/radiation-return.

Thus, according to the mentioned configuration, the photocurrent collected by the front contact-finger strips is delivered to the front busbar-base strips through their electric connection and is extracted from the semiconductor plate with small Joule losses.

In an embodiment the thermo-photovoltaic cell comprises:
- a mirror, located between the back face and the electrically conductive layer, wherein the localized electrically conductive strips are embodied as:
  - at least one back busbar-base strip arranged between the back face and the mirror, and
  - a plurality of back contact-finger strips arranged between the back face and the mirror, the back contact-finger strips being arranged intersecting at least one back busbar-base strip and making electrical contact with said back busbar-base strip and with the back face of the semiconductor plate, and wherein the mirror comprises at least one channel placed over the at least one back busbar-base strip, the at least one channel being filled with an intermediate electrically conductive material to conform an electric contact between the back busbar-base strip and the electrically conductive layer.

In this embodiment the at least one back busbar-base strip and the back contact-finger strips form a back contact grid. Additionally, the at least one three-dimensional front busbar and the front contact-finger strips form a three-dimensional front contact grid.

Throughout this document a grid should be understood as a network of spaced strips disposed in a first direction and spaced strips disposed in a second direction, wherein strips in the first direction intersect strips in the second direction, the intersection being either orthogonal or not.

The present invention uses multiple grids of different and appropriate thickness. This advantageously produces a sensible improvement in the shading/Joule-loss tradeoff.

The metals used in the grids above described present a natural high reflectance in the air, but the air/metal reflectance is sensibly reduced when they are deposited on a high index of refraction semiconductor for the range of wavelengths to which the semiconductors are transparent.

The electrically conductive layer has thus two different roles: one is the two dimensional back connection with negligible lateral Joule losses by conduction and the other is the reflection of most of the photons that reach it towards the cavity containing the incandescent body.

In an embodiment, the mirror comprises a plurality of dielectric layers, and is configured to provide very high reflectance, usually higher than 0.999, in a broad spectral range for hemispheric incidence of radiation covering the near- and mid-infrared photons. The plurality of dielectric layers may have different thicknesses and may be made of different materials. In this embodiment the thickness of the set of dielectric layers may be around 200 μm.

In an embodiment, the mirror comprises at least one photonic crystal, preferably a plurality of photonic crystals. Preferably, the plurality of photonic crystals are configured to provide very high reflection in a wide range of wavelengths and isotropic reflection to reflect isotropic incident radiation from an incandescent source.

In a preferred embodiment, the cell comprises a plurality of back busbar-base strips, preferably parallel among themselves, and the mirror comprises a plurality of channels placed over the plurality of back busbar-base strips, each channel being filled with the intermediate electrically conductive material to conform an electric contact between a corresponding back busbar-base strip and the electrically conductive layer. Preferably, the back busbar-base strips are uniformly spaced.

In an embodiment, the thermo-photovoltaic cell comprises a back pro-reflection layer arranged between the back face, covering it, and the electrically conductive layer, and the localized electrically conductive strips are embodied as a plurality of non-crossing windows, preferably made by means of etching and having a width of about 5 μm, arranged in the back pro-reflection layer and filled with the material of the electrically conductive layer to conform a plurality of back contact-finger strips which provide electric contact between the back face and the electrically conductive layer. In the present embodiment, the electrically conductive layer, together with the back pro-reflection layer, configure a mirror. In an embodiment the electrically conductive layer is formed of a high reflectance metal layer, preferably gold or silver, with a reflectance of around 0.98 separated of the semiconductor by an insulating pro-reflecting layer, thus configuring a mirror. The total thickness of the mirror (including the electrically conductive and the pro-reflecting layers) is preferably about 3.5 μm (preferably with the electrically conductive layer having a thickness of about 3 μm and the pro-reflecting layer having a thickness of about 0.5 μm). These dimensions allow the electrically conductive layer to contact the semiconductor plate through the windows. The pro-reflection layer is pierced by a plurality of strip shaped windows so that the metal layer electrically contacts the semiconductor back side, forming the plurality of contact fingers. In this embodiment the back busbars are not necessary. Comparison of embodiments including dielectric mirrors and high reflectance metal layers covered by pro-reflection layer are provided in the Detailed Description.

Thus, the pro-reflection layers advantageously render the deposited metal mirror, preferably a silver or gold mirror, into an excellent mirror for reflecting unused photons back to the hot cavity and it reduces greatly the front busbars optical absorption and has electronic beneficial features.

In an embodiment the front face and the back face of the semiconductor plate are mirror polished. In silicon PV cells it is common to texture the surfaces to enhance the so called light confinement: thus the photons of light enter into the textured silicon, start bouncing against the walls of the semiconductor plate, and cannot leave until they hit the surface within the limit angle (arcsin (1/n); n: index of refraction) of the silicon, this increases the photon path inside the silicon and helps the absorption of imperfectly absorbed photons with energy close to the silicon electronic bandgap. But the counterpart of it is leading to an enormous ($\eta^2 \sim 16$ times), increase of the brightness (watts per unit of area and per stereo-radian) of the photons which are unable to generate photocurrent. In contrast, a polished face forms a cone of photons inside the semiconductor that is reflected by the elements of the back surface and produces a second cone towards the front face that bounces many times forth and back leading to a constant brightness (Yablonovitch, E., Cody, G. D.: Intensity enhancement in textured optical sheets for solar cells. Electron Devices, IEEE Transactions on 29(2), 300-305 (1982); Luque, A.: Coupling Light to Solar Cells. In: Prince, M. (ed.) Advances in Solar Energy. vol. 8, pp. 161-230. ASES, Boulder (Colo.) (1993)).

In an embodiment the contact-finger strips are non-crossing strips, preferably arranged parallel one to another and preferably perpendicular to the busbar-base strips. Preferably, contact-finger strips are uniformly spaced. Particularly, in an embodiment, the front contact-finger strips are substantially parallel one to another, and/or the back contact-finger strips are substantially parallel one to another.

In an embodiment the busbar-base strips are formed on the corresponding face of the semiconductor plate, preferably through a contact mask. However, any other standard photolithographic procedure may be used.

In an embodiment the contact-finger strips are deposited on the corresponding face of the semiconductor plate, preferably by lift-off microelectronic technique. However, any other standard photolithographic procedure may be used.

The busbar-base strips are preferably made of silver. Their width is determined by manufacturability restrictions; in some cases 50 μm may be a reasonable value in both faces. Their thickness is preferably as thick as allowed by manufacturability, presently about 3 μm. Their spacing is about 6 mm in an embodiment.

The diameter of the conductive wire leaning in the front busbar-base strip is usually bigger than the width of the strip. In an embodiment the wire is made of copper.

The contact-finger strips are preferably made of silver. Their thickness is preferably as thick as allowed by manufacturability, presently about 3 μm. Their width is preferably as narrow as allowed by manufacturability, presently about 5 μm. Their spacing is about 6 mm in an embodiment.

In an embodiment the front busbar-base strips are wider than the front contact-finger strips and the electrically conductive wires are wider and thicker than the front busbar-base strips.

In a preferred embodiment, the busbar-base strips run along the entire width of the semiconductor plate.

In a preferred embodiment, the front contact fingers run along the entire length of the semiconductor plate.

In an embodiment, the thermo-photovoltaic cell comprises:
- at least one front pro-reflection strip, the front pro-reflection strip comprising at least one dielectric layer and being arranged between the front face and a front busbar-base strip, and/or
- at least one back pro-reflection strip, the back pro-reflection strip comprising at least one dielectric layer and being arranged between the back face and a back busbar-base strip.

A pro-refection strip or layer, adjacent to an electrically conductive strip or layer, should be understood throughout this document as one or more dielectric strips or layers whose thickness is calculated to reflect as much as possible the radiation inside the semiconductor of wavelength above the transparency threshold of said semiconductor.

In an embodiment, the cell comprises an anti-reflection coating placed on the front face, everywhere or excluding the region which is covered by front busbar-base strips.

In a particular embodiment, the thermo-photovoltaic cell comprises a plurality of front busbar-base strips, preferably parallel among themselves, and a plurality of electrically conductive wires, each electrically conductive wire being placed on a corresponding front busbar-base strip. Preferably, the front busbar-base strips are uniformly spaced.

In a particular embodiment, the electrically conductive wires are three dimensional, wherein preferably the electrically conductive wires have a cross section area of at least 3000 times the cross section area of the front contact-finger strips, which advantageously allows a higher efficiency of the cell.

In an embodiment the semiconductor plate comprising at least one pn junction or one np junction or one heterojunction may also comprise the plurality of junctions to form a multiple junction solar cell.

In an embodiment the thermo-photovoltaic cell comprises a cooling element attached to the back side of the thermo-photovoltaic cell, the back side being the side of the thermo-photovoltaic cell where the electrically conductive layer is located. The cooling element is configured for transferring heat to a coolant fluid.

In a second inventive aspect a module is defined comprising at least one thermo-photovoltaic cell according to any of the embodiments of the first inventive aspect.

In an embodiment the module includes a plurality of thermo-photovoltaic cells connected in series and/or in parallel to obtain comfortable current and voltage levels for the use of the electricity produced.

In an embodiment the module contains means for cooling the thermo-photovoltaic cells so that they are able to operate at a moderate temperature, without which they might lose efficiency and even result damaged by the source of heat situated closely nearby.

In an embodiment the module contains protective elements against mechanical and/or temperature damage.

In an embodiment the module comprises a plurality of thermo-photovoltaic cells, a first end holder, a second end holder and at least one intermediate holder;
  wherein the first end holder, the second end holder and the intermediate holders are electrically conductive;
  wherein the thermo-photovoltaic cells are placed on and attached to the first end holder and the intermediate holders;
  wherein the intermediate holders comprise a flange at one end, the flange comprising a plurality of notches aligned to the front busbar-base strips of the thermo-photovoltaic cells;
  wherein the first end holder comprises an elongated portion configured as a first external connection;
  wherein the second end holder is intended to act as a second external connection;
  wherein the electrically conductive wires are arranged along the notches of the holders, such that the electrically conductive wires of the thermo-photovoltaic cells placed on a holder are connected to the flange of an adjacent holder.

In this embodiment of the module, the thermo-photovoltaic cells placed on the same holder are connected electrically in parallel, whereas the thermo-photovoltaic cells of adjacent holders are connected electrically in series. The first end holder and the second end holder provide the external connections of the module.

The first operation to achieve a module is that of providing the TPV device holders. The length of the holder is preferably a multiple of the length of the TPV cells in order to hold one or several of them.

In an embodiment, the TPV cells are attached to the holders, preferably by solder metal and/or conductive glue, thus resulting in the connection in parallel of all the TPV cells of the same holder.

The holders may be embodied as supporting plates, wherein the one or more intermediate holders and the second end holder comprise a flange at one of its sides, preferably being substantially perpendicular to a portion intended to receive the photovoltaic cells.

In an embodiment the holders are made of metal, preferably a metal sheet, particularly of copper, kovar, invar or any other alloy with small thermal expansion to match better that of the semiconductors.

Preferably, the module comprises a plurality of intermediate holders.

In a preferred embodiment, the flange edge comprises a set of grooves or notches, preferably one per electrically conductive wire for each of the TPV cells which are connected in parallel.

Preferably, the thickness of the grooves or notches is that of the electrically conductive wires diameter to allow passing the electrically conductive wires through these notches.

Therefore, the electrically conductive wires will be passed through all the notches, aligned with the busbar-bases. In this operation, the electrically conductive wires will be bonded to the busbar bases and to the grooves forming a grid, achieving a connection in parallel of all the TPV cells.

In a particular embodiment, by cutting the electrically conductive wires in positions adjacent to the flanges at the exterior side of the holders, said holders will be connected in series thus forming a collection of parallel/series TPV cells.

In an embodiment the module further comprises cooling means, particularly a cooling element, attached to the holders, i.e. attached to the first end holder, the second end holder and/or the intermediate holders. Preferably, the cooling element is dimensioned with an area corresponding to the plurality of holders in the module. Preferably, the cooling element is configured for transferring heat from the cell to a coolant fluid, such as water.

In an embodiment the cooling element is insulated with a sheet of non-electrically conductive material that is a good heat conductor.

In a particular embodiment, when all the TPV cells are connected with the holders, said holders will be connected to the cooling means, preventing electric contact. To this end the sheet of electric insulator will be located between the holders and the cooling means to insulate them electrically. The sheet of electric insulation must also show good heat conductance.

In an embodiment the cooling element is attached to the holders with glue with good thermal conduction, preferably leaving narrow gaps among said holders to preserve the series insulation of the neighbouring holders.

In a third inventive aspect, an energy storage system comprises at least one thermo-photovoltaic cell according to the first inventive aspect and an incandescent cavity configured to contain an incandescent material inside; wherein the incandescent cavity comprises a wall having a window and the thermo-photovoltaic cell is attached to the window.

In connection with the present energy storage system, five important power flux concepts are to be considered:
  the input radiation power flux $P_i$ (watts per unit area, often calculated by the Stefan-Boltzmann law),
  the extracted electric power flux $P_e$,
  the thermal power flux $P_t$ removed by the cooling means from the PV cells transfer of heat to the cold flowing water, and
  the power flux $P_l$ which is the undesired heat lost including the heat leaks in the cavity.

In TPV cells part of the incident radiation flux $P_r$ is reflected or returned to the incandescent cavity through its window. The following relationship is assumed to hold:

$$P_i = P_e + P_t + P_r + P_l \tag{1}$$

If $P_l = 0$, the incandescent cavity is ideal and the calculated TPV efficiency will be that of the TPV cell.

The following definitions and relations are also considered:

$$\tilde{\eta}_{PV} = \frac{P_e}{P_i}; \tilde{\eta}_{TPV} = \frac{P_e}{P_i - P_r} = \frac{P_e}{P_w}; \frac{\tilde{\eta}_{PV}}{\tilde{\eta}_{TPV}} = 1 - \frac{P_r}{P_i} \quad (2)$$

wherein $P_e$ can be modified from zero (PV cell in short or in open circuit) to its maximum value.

Additionally:

$$P_w = P_i - P_r \quad (3)$$

is the thermal power wasted from the heat reservoir when producing electricity. In a module with $P_t=0$, $P_w=P_e+P_t$ and since $P_w$ does not change with the electric power extracted from the TPV cell, the extraction of electric power reduces the term $P_r$, only affecting the cooling of the PV cells, not to the wasted power $P_w$.

In a fourth inventive aspect a method of manufacturing a thermo-photovoltaic cell, according to any embodiment of the first inventive aspect, is defined, the method comprising the following steps:
  a) providing a semiconductor plate, the semiconductor plate having a front face and a back face and comprising at least one pn junction or one np junction or one heterojunction,
  b) processing the front face, wherein the processing of the front face comprises the following steps:
    depositing on the front face at least one front busbar-base strip, the front busbar-base strip being electrically conductive,
    depositing a plurality of front contact-finger strips on the front face, intersecting at least one front busbar-base strip and making electrical contact with said front busbar-base strip and with the semiconductor plate, the plurality of front contact-finger strips being made of electrically conductive material,
    placing at least one electrically conductive wire on the at least one front busbar-base strip,
  c) processing the back face, wherein the processing of the back face comprises the following steps:
    depositing an electrically conductive layer at said back face.

The step of placing at least one electrically conductive wire on the at least one front busbar-base strip is performed when manufacturing the cell.

However, when the manufacturing is performed in order to achieve a module, said step of placing at least one electrically conductive wire on the at least one front busbar-base strip can be performed in a subsequent step of the manufacturing of said module.

In an embodiment the method comprises depositing an anti-reflection coating on the front face, on the region which is not covered by the front busbar-base strips. The anti-reflection coating reduces the reflection of the photocurrent-generating radiation absorbed by the semiconductor, that is, the radiation below the transparency threshold, thus increasing the photocurrent.

In a preferred embodiment the anti-reflection coating comprises one or two layers of dielectric materials of different indexes of refraction, which are also optimized in thickness (see for example Born, M. et al.: Principles of Optics, Pergamon Press, Oxford (1975)). It is convenient to prevent these layers from depositing on the front busbar-base strips. For this a contact mask may be used that is approximately the negative of the contact mask used for depositing the front busbar-base strips; this contact mask may have the shape of a series of thin metal strips. In this way the anti-reflection coating occupies most of the front face of the semiconductor plate, with the exception of the front busbar-base strips but covers the front contact-finger strips. Other microelectronic procedures may also be used, for instance photolithography. This step of applying an anti-reflection coating to the front face may be performed before the placement of the front busbar wire.

In an embodiment of the method, step c) comprises:
  prior to providing the electrically conductive layer, depositing on the back face at least one back busbar-base strip, the back busbar strip being electrically conductive,
  depositing a plurality of back contact-finger strips intersecting the at least the one back busbar-base strip and making electrical contact with the back busbar-base strip and the semiconductor plate, the back contact-finger strips being made of electrically conductive material,
  providing a mirror by depositing a plurality of dielectric layers and covering the back contact-finger strips and the at least one back busbar-base strip,
  digging in the mirror at least one channel placed over the at least one back busbar-base strip,
  filling the at least one channel with an intermediate electrically conductive material, and
  covering the mirror with the electrically conductive layer, wherein the intermediate electrically conductive material within the at least one filled channel conforms an electric contact between the back busbar-base strips and the electrically conductive layer.

According to this embodiment, after opening the channels in the back face, they are filled with an electrically conductive material, preferably a malleable metal, such as indium, or a low melting-point conducting bonding paste that has similar malleability. If necessary, heat can be applied to the plate to promote easier filling of the channels. Any method of filling the channels with an electric conductor, for instance, by injecting a conductive paste with a micro nozzle, may be used.

In this embodiment the back busbar-base strip and the electrical conducting material filling the at least one channel, together, form the back busbar which is adapted to contact with the continuous electrically conductive layer, preferably metal, which so forms the thermo-photovoltaic cell back electrode. The electrically conductive layer is preferably made of a material of high reflectance, for instance silver, so improving the reflectance of the dielectric mirror.

Besides using a mini-milling or -saw wafer-dicing machine, the channels may be dug by means of laser, by means of ion drilling or by any other way.

In another embodiment of the method, step c) comprises:
  prior to providing the electrically conductive layer, depositing a back pro-reflection layer covering the whole back face,
  perforating the back pro-reflection layer to form a plurality of windows, and
  providing the electrically conductive layer by depositing a metal layer on the back of the pro-reflection layer, the material of the electrically conductive layer going through the plurality of windows to conform an electric contact between the back face and the electrically conductive layer.

According to this embodiment a pro-reflection layer is deposited on the whole back face, intended to increase the reflectance of the layer, preferably metal, to be deposited subsequently. Then, before depositing the metal, strip-shaped windows are formed on the pro-reflection layer to form back contact fingers. This may be performed using standard photolithographic techniques. Finally, an electrically conductive layer, for example of silver, is deposited on the whole back surface of the plate, forming a mirror in most of it and also forming through the windows the back contact fingers. The back mirror so formed has an enhanced reflectance by the pro-reflection layer.

Advantageously, in this embodiment no accurate alignment is required to produce the mirror and the back contact fingers.

In a preferred embodiment a plurality of front and back busbar-base strips are deposited.

In an embodiment the busbar-base strips are deposited on the corresponding face of the semiconductor plate, preferably through a contact mask. However, any other standard procedure may be used.

In an embodiment, the method further comprises the steps:
prior to depositing the at least one front busbar-base strip, depositing on the front face at least one front pro-reflection strip, the front pro-reflection strip comprising at least one dielectric layer, and the at least one front busbar-base strip being deposited on the front pro-reflection strip, and/or
prior to depositing the at least one back busbar-base strip, depositing on the back face at least one back pro-reflection strip, the back pro-reflection strip comprising at least one dielectric layer, and the at least one back busbar-base strip being deposited on the back pro-reflection strip.

In a preferred embodiment pro-reflecting strips are deposited between the semiconductor and the busbar base strips on each face, possibly with the same contact mask for the pro-reflecting and the busbar-base strips, however any other standard photolithographic procedure may be used.

In an embodiment the contact-finger strips are deposited on both faces of the semiconductor plate, preferably by lift-off microelectronic technique. However, any other standard photolithographic procedure may be used.

The busbar-base strips are preferably made of silver. Their width is determined by manufacturing restrictions; usually 50 μm is a reasonable value in both faces. Their thickness is preferably as thick as allowed by manufacturability, presently about 3 μm, and their spacing is approximately 6 mm in an embodiment.

In an embodiment the conductive wire leaning in the front busbar-base strip is made of copper or tinned copper.

The contact-finger strips are preferably made of silver. Their thickness is preferably as thick as allowed by manufacturability, presently about 3 μm; their width is preferably as narrow as allowed by manufacturability, presently about 5 μm.

All the features described in this specification (including the claims, description and drawings) and/or all the steps of the described method can be combined in any combination, with the exception of combinations of such mutually exclusive features and/or steps.

DESCRIPTION OF THE DRAWINGS

These and other characteristics and advantages of the invention will become clearly understood in view of the detailed description of the invention which becomes apparent from a preferred embodiment of the invention, given just as an example and not being limited thereto, with reference to the drawings.

DETAILED DESCRIPTION OF THE INVENTION

Figure 1:
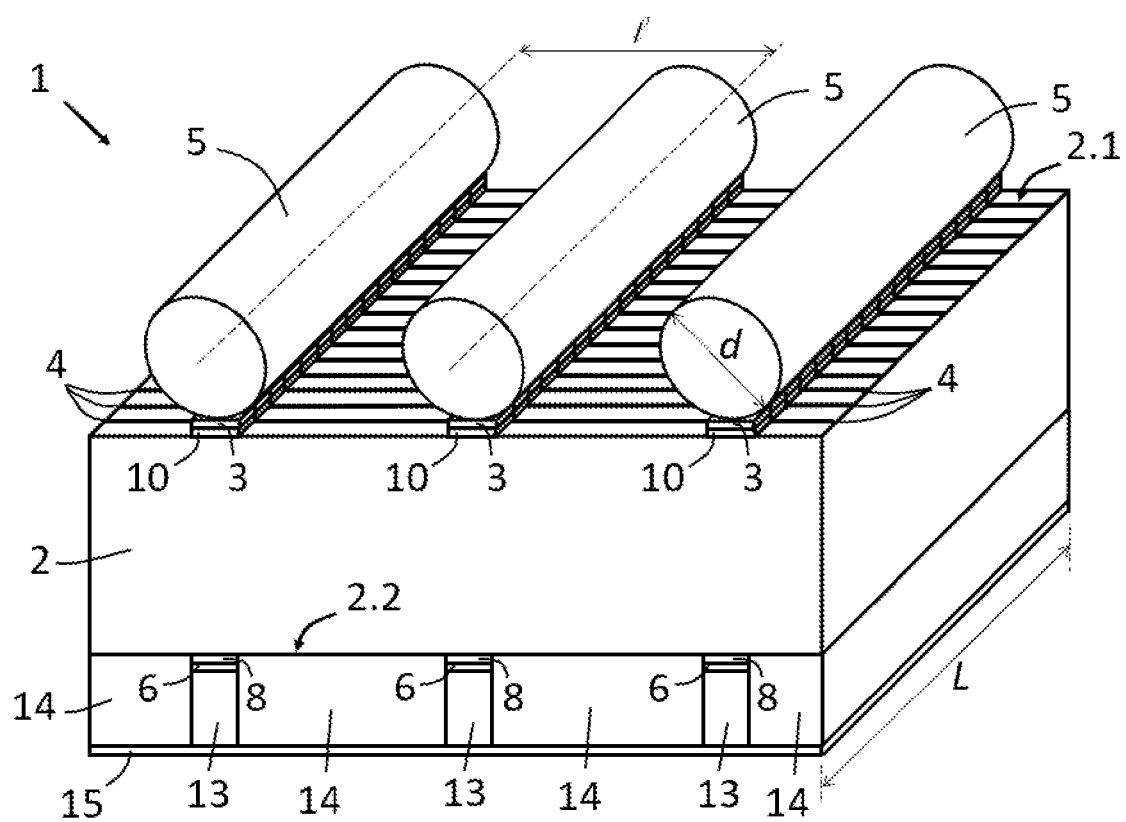
FIG. 1 shows a three-dimensional view from the top of a thermo-photovoltaic cell according to an embodiment of the invention.

Thermo-photovoltaic cells (1) according to embodiments of the invention are shown in FIGS. 1 to 10. A thermo-photovoltaic cell (1) according to the invention comprises a semiconductor plate (2), several front busbar-base strips (3), a plurality of front contact-finger strips (4), several electrically conductive wires (5) on top of the front busbar-base strips (3), forming a three-dimensional busbar, and an electrically conductive layer (9, 15) in electrical contact with the back face (2.2) of the semiconductor plate (2), said contact restricted to highly localized electrically conductive strips (7).

FIG. 1 shows one of the embodiments of this invention. The semiconductor plate (2) has a front face (2.1) and a back face (2.2), and comprises at least one pn junction or one np junction or one heterojunction, but possibly several junctions and heterojunctions in different semiconductor layers, not shown. In an embodiment the semiconductor plate (2) is made of germanium. Several front busbar-base strips (3), preferably about 50 μm wide, are placed on the front face (2.1). In this embodiment, the front busbar-base strips (3) are placed on top of pro-reflection strips (10), which electrically insulates the front busbar-base strips (3) from the semiconductor plate (2). The plurality of front contact-finger strips (4), each about 5 μm wide in a preferred embodiment, are made of an electrically conductive material, for example metal, and are arranged intersecting and electrically contacting the front busbar-base strips (3). Also, the plurality of front contact-finger strips (4) are arranged making electrical contact with said front busbar-base strips (3) and with the front face (2.1) of the semiconductor plate (2). The electrically conductive wires (5), preferably of about 3 mm of diameter, are placed on the corresponding front busbar-base strips (3) aligned with them, forming with them complete three-dimensional busbars.

Figure 2:
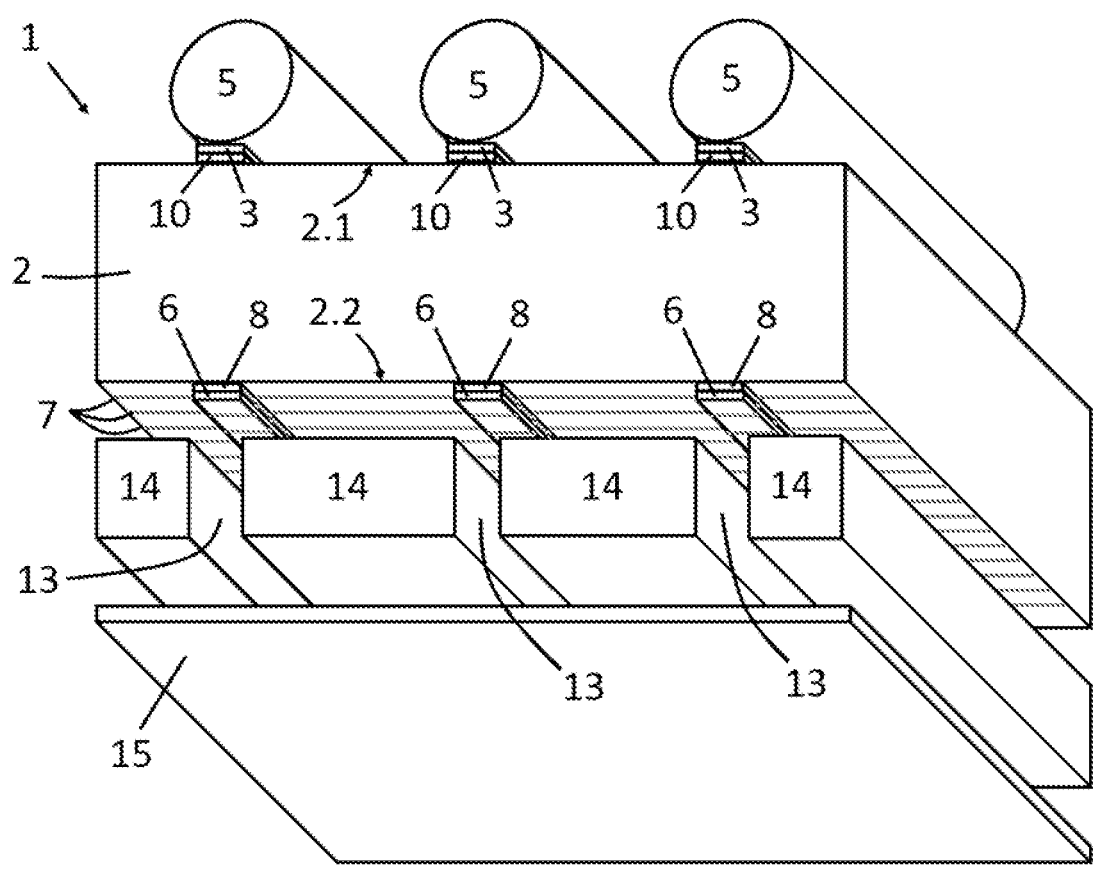
FIG. 2 shows a three-dimensional exploded view from the bottom of a thermo-photovoltaic cell according to an embodiment of the invention.

The back face (2.2) of the thermo-photovoltaic cell (1) is shown in the exploded view of FIG. 2. In certain embodiments it includes the back contact-finger strips (7), as an embodiment of an electrically conductive strip, preferably each about 5 μm wide, that electrically contact the semiconductor back face (2.2), cross and electrically contact several back busbar-base strips (6), preferably about 50 μm wide. In some preferred embodiments the back busbar-base strips (6) are electrically insulated from the semiconductor plate (2) by dielectric pro-reflection strips (8). As seen in FIG. 2, in this embodiment a mirror (14) is deposited onto the back face (2.2) of the semiconductor plate (2) enclosing between the mirror (14) and the semiconductor plate (2) the plurality of back contact-finger strips (7). The back contact-finger strips (7) do not contact electrically the mirror (14) because it is made of a plurality of insulating dielectric layers. In an embodiment, the mirror (14) is about 200 μm thick. Channels (13) are dug in the mirror (14), at the back busbar-base strips (6) separating the mirror (14) in several parts (14), which are better seen in FIG. 2. These channels (13) are filled with a conducting material and an electrically conductive layer (15) is located such that the portions of the mirror (14) and the conductor-filled channels (13) contact the electrically conductive layer (15), connecting said layer (15), preferably metallic, which acts as the back electrode, to the back busbar-base strips (6) and also to the semiconductor plate (2). This connection is not direct but through the back contact-finger strips (7).

The thermo-photovoltaic cell (1) according to this invention is able to receive radiation of an incandescent source and return to it a large amount of unused radiation. In a preferred, but not unique embodiment, the incandescent source may be melting silicon (preferably with the solid and liquid phases in coalescence), but many other alloys may be very attractive. Silicon metal (not ultra-purified) is very cheap and has a very high latent heat of fusion (50.55 kJ/mol, about 50% above most materials) and can be sensibly increased if mixed with boron. The melting point of the Si is 1410° C. and is reduced with the addition of boron. It is a material attractive for energy storage and recovery by thermo-photovoltaics. However, the conversion of heat into electricity from molten iron (latent heat of fusion, 13.8 kJ/mol; melting point, 1538° C.; both data for pure iron) and its alloys may today be of economic interest.

The semiconductor plate (2) of the thermo-photovoltaic cell (1) may be made of Ge or several other materials with similar bandgap. Among semiconductors with a bandgap of about 0.7 eV we may find Ge (0.67 eV), GaSb (0.726 eV) or InGaAs (variable bandgap, 0.7 eV for $In_{0.58}Ga_{0.42}As$), or even a double junction device with two InGaAsSb semiconductor regions of different compositions and bandgaps, both adapted to the lattice constant of the GaSb crystals on which these semiconductors can be grown epitaxially. But very high quality dielectric mirrors also allow for the use of materials which are not well adapted to the spectrum of the incandescent materials. Si cells can be used, with the advantage that they are very cheap. Ge is also attractive because Ge semiconductor plates are a component of triple junction solar cells, of use in space and concentrator cells, so that with some modifications Ge semiconductor plates can be obtained from manufacturers of triple junction solar cells.

As it has been explained the pro-reflection strips (8, 10), located in both semiconductor faces (2.1, 2.2) prevent the electric contact of the front and back busbar-base strips (3, 6) and the semiconductor plate (2). This contact is a source of electron-hole recombination in semiconductor devices resulting is reduction of the thermo-photovoltaic cell (1) voltage. But, in addition, the pro-reflection strips (8, 10) have the role of enhancing the reflection of the radiation by the busbar-base strips (3, 6) so reducing their absorption. Obviously the absorbed radiation cannot be returned to the radiation source. The thickness of the pro-reflection strips (8, 10) may be calculated (Born, M. et al.: Principles of Optics. Pergamon Press, Oxford (1975)) to reflect as much as possible the radiation above the transparency threshold. In an embodiment the thickness of the pro-reflection strips (8, 10) is in the range of 0.5 μm.

Adjacent to each pro-reflection strip (10, 8) one front or back busbar-base strip (3, 6) is arranged. In this embodiment, the front and back busbar-base strips (3, 6) are made of metal, preferably silver, and have the same width as the front and back pro-reflection strips (10, 8) and a thickness of about 3 μm. The front and back pro-reflection strips (10, 8) and the front and back busbar strips (3, 6) may be deposited on the semiconductor plate (2) using the same contact mask. The purpose of the front busbar-base strips (3) is to serve as a base to the wires (5) and to make electrical contact with the wires (5) and the front contact-finger strips (4) whereas the purpose of the back busbar-base strips (6) is to make electrical contact with the back contact-finger strips (7) and with the intermediate conductive material filling the channels (13) and through them with the electrically conductive layer (15), made of metal. In a preferred embodiment, the front and back busbar strips (3, 6) run along the thermo-photovoltaic cell (1) over its entire width.

In the embodiment of FIGS. 1 and 2, a plurality of front and back contact-finger strips (4, 7) is arranged on both faces (2.1, 2.2) of the semiconductor plate (2), preferably deposited by lift-off microelectronic technique. The front and back contact-finger strips (4, 7) are directly deposited on the semiconductor plate (2) and electrically connected to the busbar-base strips (3, 6) of the corresponding face (2.1, 2.2). In this embodiment the front and back contact-finger strips (4, 7) are perpendicular to the front and back busbar-base strips (3, 6) respectively, and run along the whole length of the thermo-photovoltaic cell (1) but other crossing angles between the front and back busbar-base strips (3, 6) and the front and back contact-finger strips (4, 7) are possible. In an embodiment the front and back contact-finger strips (4, 7) are about 3 μm thick and about 5 μm wide. In a preferred embodiment the front and back contact-finger strips (4, 7) are made of silver.

In FIG. 1 the cell width (L), the wire diameter (d) and the busbar period (l) are shown.

Figure 3:
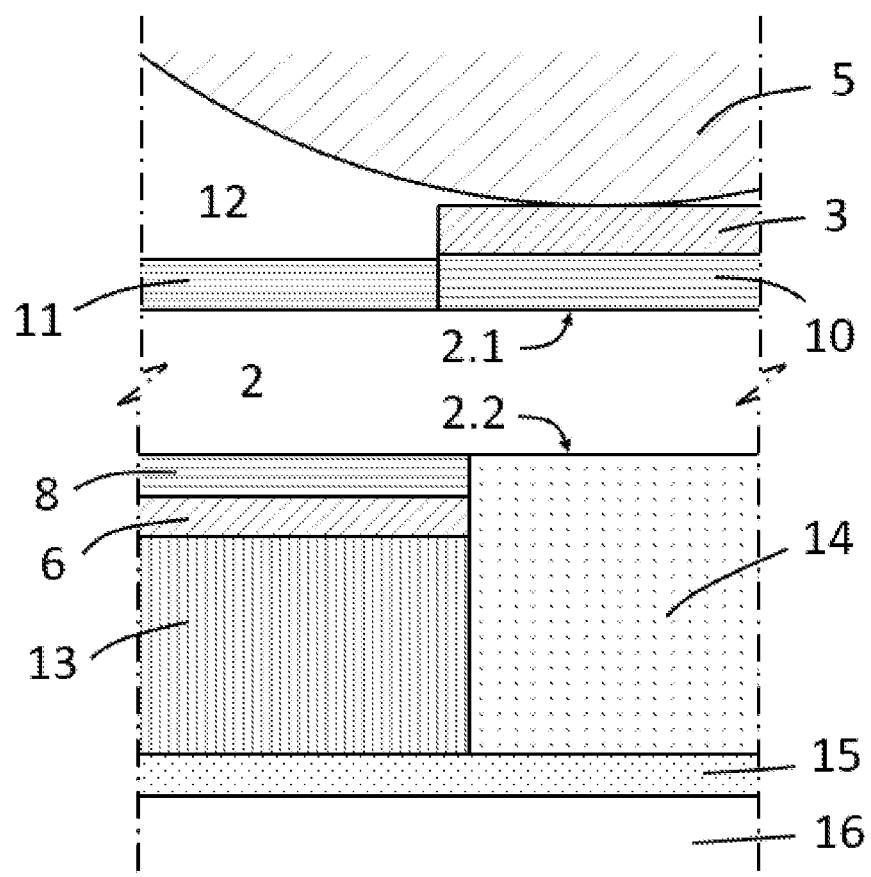
FIG. 3 shows a partial cross section of an embodiment of the thermo-photovoltaic cell by a plane perpendicular to one wire.
Figure 4:
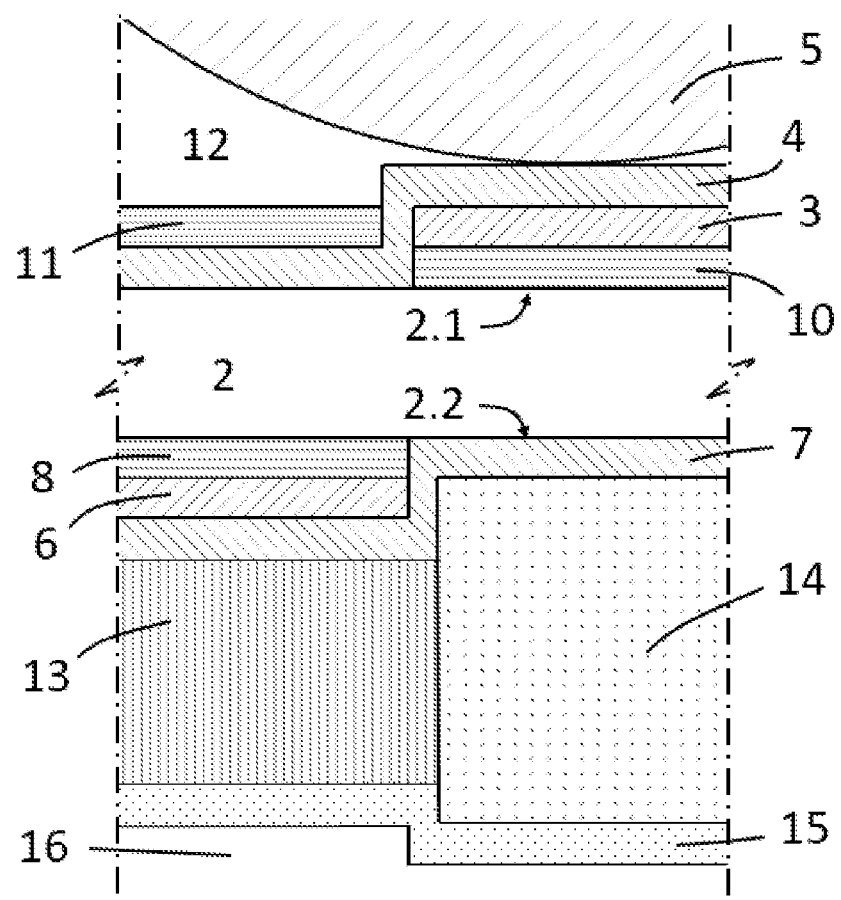
FIG. 4 shows a partial cross section of an embodiment of the thermo-photovoltaic cell by a plane perpendicular to one wire and along a front or back contact-finger strip.

FIGS. 3 and 4 show partial cross-sections by a plane normal to one wire (5) of an embodiment of a thermo-photovoltaic cell (1). The view of FIG. 3 may correspond to a partial cross-section of FIG. 1 in the neighbourhood of a front or back busbar-base strip (3, 6) in the front (2.1) and back (2.2) face; the section plane does not touch any front or back contact-finger strips (4, 7). In the view of FIG. 4 the plane also intersects a front and a back contact-finger strip (4, 7), which are shown aligned in this figure. However, the front and back contact-finger strips (4, 7) may have different periods and need not be aligned.

All the elements of these cross sections have already been described in relation with FIGS. 1 and 2 with the exceptions that are explained now. In FIGS. 3 and 4, there is an anti-reflection coating (11), usually made of one or more dielectric layers. The thickness of the layers (see e.g. Luque, A.: *Solar Cells and Optics for Photovoltaic Concentration*, Adam Hilger, Bristol (1989), Chap. 14.) are preferably properly calculated and optimized, and they are preferably in the range of 0.1 µm thick, they are to be deposited before the wire (5) is attached. To facilitate the electrical contact between wires (5) and front busbar-base strips (3), the anti-reflection coating (11) may be deposited though a contact mask which is the negative of the one used to deposit the pro-reflecting strips (10, 8) and the front busbar-base strips (3), or alternatively, windows may be made on the coating (11) using photolithographic means. Reference number 12 refers to the outside of the thermo-photovoltaic cell (1); it can be just air or can be a transparent protective thick layer made, for instance, of silicone. Reference number 16 refers to an electrical conductive paste for gluing the cell (1) to a supporting plate to form modules.

Figure 5A:
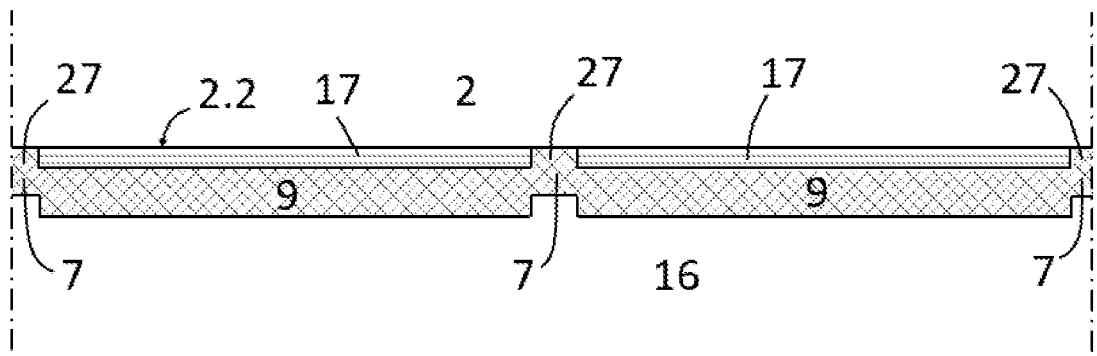
FIGS. 5A and 5B show, respectively, a partial cross section according to a plane perpendicular to the back contact-finger strips of a thermo-photovoltaic cell corresponding to an embodiment of the invention, and the same partial cross section as an exploded view.

FIG. 5A shows a partial cross-section to the plane perpendicular to the back contact-finger strips (7) of a thermo-photovoltaic cell (1) corresponding to another embodiment of this invention. Specifically, a sector around three back contact-finger strips (7) near the back face (2.2) of the thermo-photovoltaic cell (1) is shown in this figure. This cutting plane is also perpendicular to those in FIGS. 3 and 4. In this embodiment, the back face (2.2) of the photovoltaic cell (1) is different to the one described in connection with the embodiment of FIGS. 3 and 4. In this embodiment the thermo-photovoltaic cell (1) comprises a back pro-reflection layer (17) deposited on the back face (2.2) of the semiconductor plate (2) and a plurality of windows (27) are etched on it. The back pro-reflection layer (17) is deposited covering the whole back face (2.2) of the semiconductor plate (2). The windows (27), usually strip shaped, are made by etching away by photolithography the back pro-reflection layer (17) in all its thickness. A mirror is embodied by means of the electrically conductive layer (9), preferably a gold or silver layer, and the back pro-reflection layer (17), and the window (27) of the back pro-reflection layer (17), being filled with the material of the electrically conductive layer (9), conforms a back contact-finger strip (7) that provides an electrical contact between the semiconductor plate (2) back face (2.2) and the electrically conductive layer (9) which so becomes the back electrode of the thermo-photovoltaic cell (1). The mirror formed by said electrically conductive layer (9) and back pro-reflection layer (17) may be covered with a conductive glue of electricity and heat (16) to stick the thermo-photovoltaic cell (1) to a supporting plate (the supporting plate is not shown in FIG. 5A).

Figure 5B:
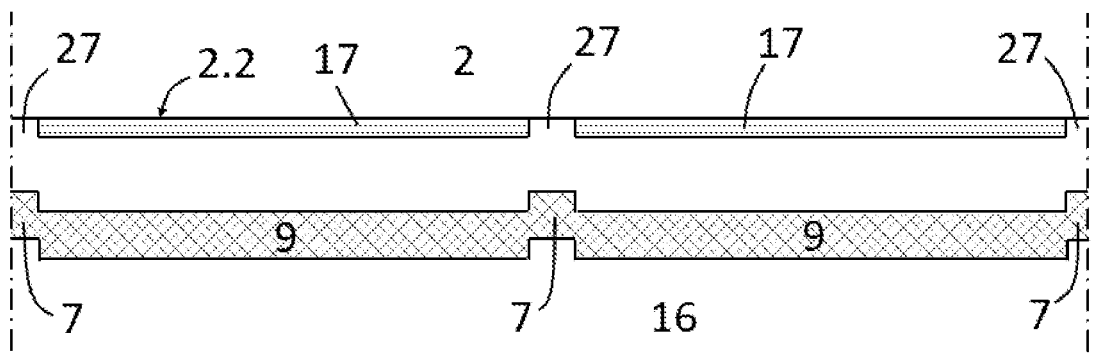

The same configuration as the one previously described is shown in FIG. 5B, but as an exploded view, for ease of the recognition of every disclosed element.

Figure 6:
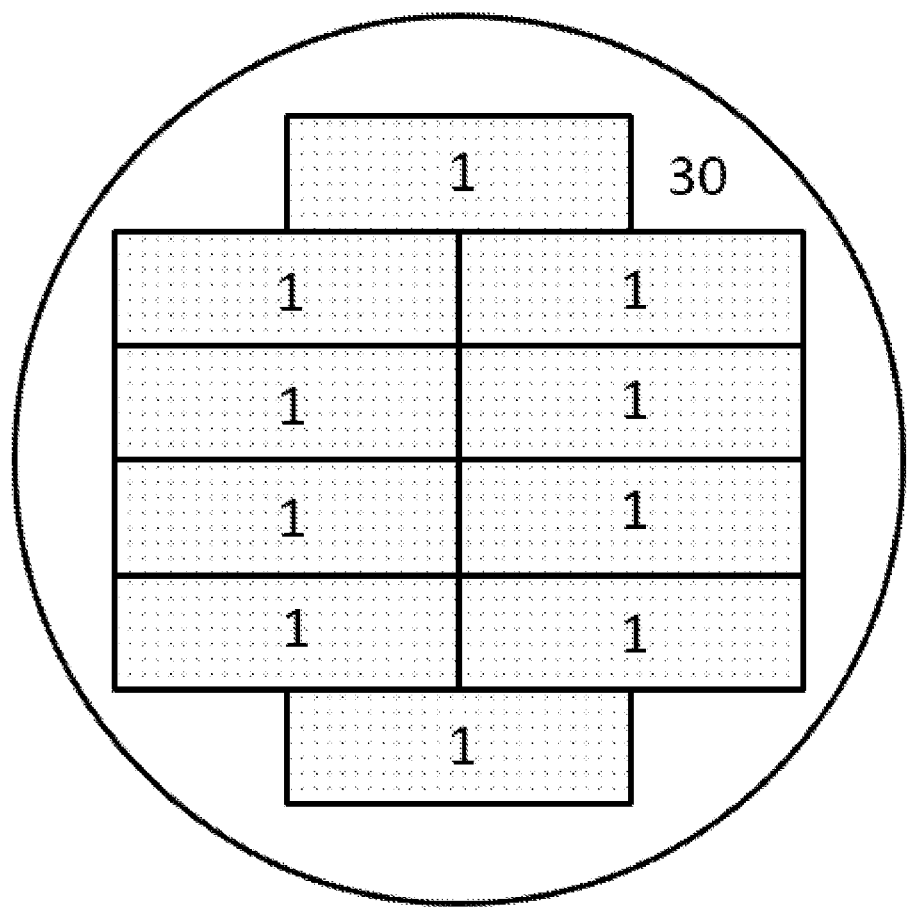
FIG. 6 shows rectangular thermo-photovoltaic cells manufactured on the same semiconductor wafer.

A plurality of thermo-photovoltaic cells (1) according to the invention may be manufactured on a unique semiconductor wafer (30). In a preferred embodiment a pre-processed semiconductor wafer (30) is used in which the relevant pn junctions, np junctions or heterojunctions have been made to form several photovoltaic cells (1). FIG. 6 shows rectangular thermo-photovoltaic cells (1) manufactured on the same semiconductor wafer (30).

When several thermo-photovoltaic cells (1) are manufactured on the same semiconductor wafer (30), the manufacturing steps of the method of the invention are preferably performed on the thermo-photovoltaic cells (1) included in the wafer (30) and the necessary cuts are subsequently made in the wafer (30) to separate the individual thermo-photovoltaic cells (1).

Figure 7:
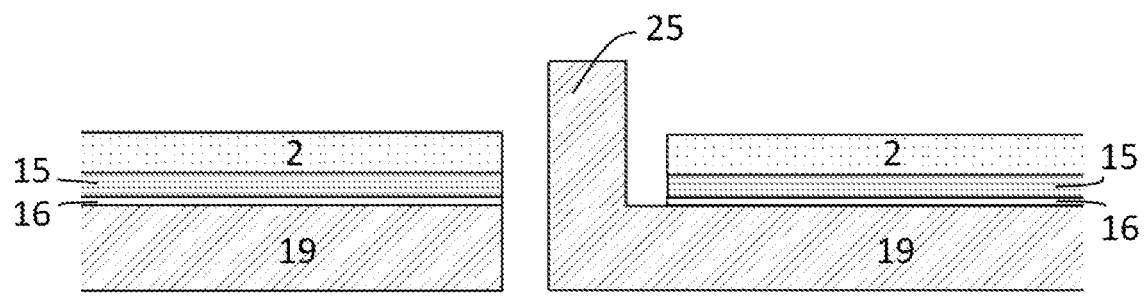
FIG. 7 shows a detail of the assembly of two adjacent thermo-photovoltaic cells adhered on two adjacent supporting plates (cross-sectional view).
Figure 8:
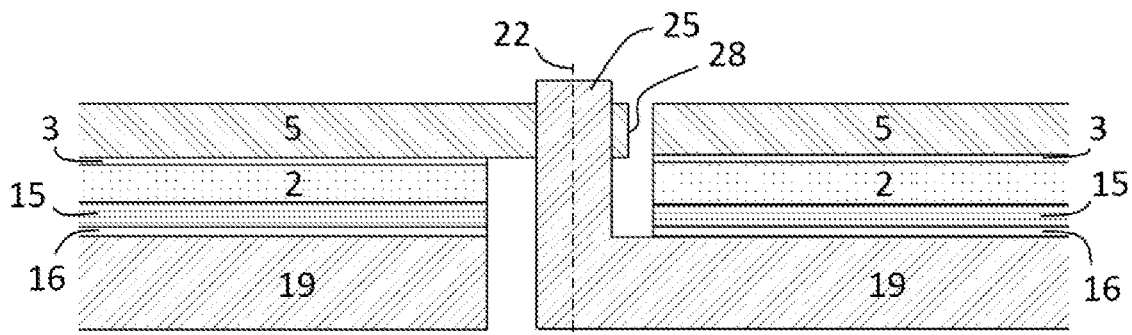
FIG. 8 shows a cross section of the assembly shown in FIG. 7 which now comprises one of the wires.
Figure 9:
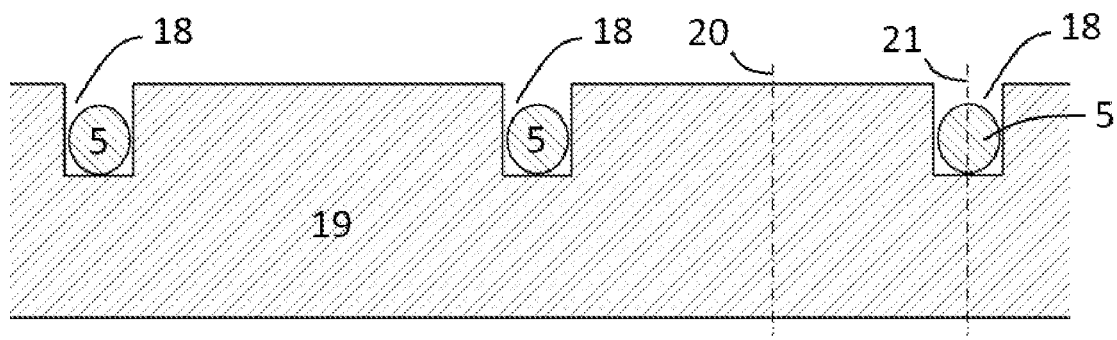
FIG. 9 shows a cross section of the assembly of FIG. 8 made along the normal plane passing through the dot-dash line.

As shown in FIGS. 7-9, the thermo-photovoltaic cells (1) may be fixed, one by one or in groups of two or more, to a supporting plate (19), in order to form a thermo-photovoltaic module, these thermo-photovoltaic cells (1) becoming connected in parallel by the supporting plate (19). Preferably, the thermo-photovoltaic cells (1) are glued to the supporting plate (19) using an electricity and heat conducting resin (16). Preferably, the supporting plate (19) is made of metal and has a length similar to the sum of lengths of the parallel connected thermo-photovoltaic cells (1). In an embodiment two germanium thermo-photovoltaic cells (1), 6 cm long each, are connected in parallel with a total plate length of 12 cm. The width of the supporting plate (19) is preferably as that of the thermo-photovoltaic cells (1), for example, 2 cm. In an embodiment, the material of the supporting plate (19) is copper or any alloy with a low thermal-expansion coefficient, such as kovar. Next to this supporting plate (19) may be an adjacent supporting plate (19) with corresponding thermo-photovoltaic cells (1) connected in series with the first supporting plate (19), as described below.

FIG. 7 shows a detail of the assembly of two adjacent thermo-photovoltaic cells (1) adhered on two adjacent supporting plates (19) (cross-sectional view). In this figure two supporting plates (19) can be seen, on which the electrically conductive layers (15) of two thermo-photovoltaic cells (1) are adhered using a heat and electricity conductive paste (16). The heat and electricity conductive paste (16) glues and contacts the supporting plate (19) to the thermo-photovoltaic cells (1). The supporting plates (19) are provided with a flange (25) in one end. This description refers to the embodiment of the thermo-photovoltaic cell having a dielectric mirror, as the one disclosed in FIGS. 1-4. However, the same set up is applicable to the embodiment having a metallic mirror, as disclosed in connection with FIGS. 5A-5B.

FIG. 8 shows a cross section of the assembly shown in FIG. 7 which now comprises one of the wires (5). The wire (5) lies on a front busbar-base strip (3) deposited on the semiconductor plate (2), the front busbar-base strip (3) being preferably electrically separated by a front pro-reflection strip, not shown in this figure.

FIG. 9 shows a cross section of the assembly of FIG. 8 made across the normal plane passing through the dot-dashed line (22) of FIG. 8. FIGS. 7 and 8 are the cuts of FIG. 9 by the dot-dashed lines (20) and (21), respectively (strictly speaking FIG. 8 is not the cut by line 21 because the top of the flange should be invisible). In FIG. 8 the wire (5) is cut (28) allowing for the series connection of the two thermo-photovoltaic cells (1). The flange (25) of the supporting plate (19) can be seen in FIG. 9, as well as notches (18) made in the rim of the flange (25). Through these notches (18) wires (5) are introduced and bonded. The width of the notches (18) is the diameter of the wire (5). The depth of the notches (16) allows the wire (5) to rest on the front busbar-base strip (3) (see FIGS. 1-4), thickened by the front contact-finger strips (4) when the front busbar-base strip (3) is crossed by them (see FIG. 4).

In an embodiment the wires (5) are soft-bonded to the flange (25) at the notches (18) and at some enlarged points of the front busbar strip (3), or alternatively to the whole front busbar-base strip (3). Once the bonding process is finished for the whole module, the wires (5) are cut (28) between thermo-photovoltaic cells (1), thus providing a connection of the front face (2.1) of the semiconductor plate (2) of the thermo-photovoltaic cells (1) at the left of FIG. 8 with the back face (2.2) of the semiconductor plate (2) of the thermo-photovoltaic cells (1) at the right, causing a series connection of the thermo-photovoltaic cells (1) contained on the two supporting plates (19). As regards to the thermo-photovoltaic cells (1) located on the same supporting plate (19), they are connected in parallel by the supporting plate (19) for the back connection, and by the wires (5) bonded to the flange (25) of the supporting plate (19) for the front connection.

In FIGS. 7 to 9, only some elements of the thermo-photovoltaic cells (1) are shown for simplicity. However, it should be understood that the thermo-photovoltaic cells (1) include the additional elements according to the invention. Also, although an electrically conductive layer (15) according to the embodiment of FIGS. 1-4 has been identified in the figure, the thermo-photovoltaic cells (1) may be according to the embodiment of FIG. 5 or according to any embodiment of the invention.

Figure 10:
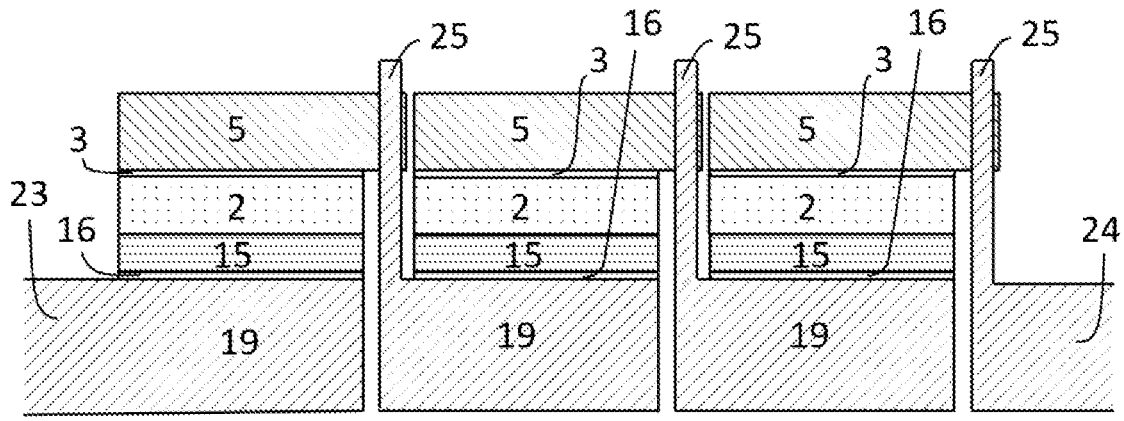
FIG. 10 shows a cross section of an assembly of several adjacent thermo-photovoltaic cells.

FIG. 10 shows a cross section of an assembly of several adjacent thermo-photovoltaic cells (1) to present in more detail how a module may be formed. This figure shows mainly the ends of a string of thermo-photovoltaic cells (1) in series. The thermo-photovoltaic cells (1) are placed and connected in parallel to their supporting plate (19). The wire (5) is placed bonded to the front busbar-base strip (3) and to the notches (18) of the flanges (25) of the supporting plates (19) and the wire (5) is cut (28) at the right of the next supporting plate flange.

The leftmost supporting plate (19) in the figure has no flange and is, in addition to the supporting plate (19) of the thermo-photovoltaic cells (1), a first electrode (23) of the module, for example the positive electrode, which is extended out of any protection with the desired length. The first electrode (23) is used to make the external connections to another module, to an AC/DC converter or to another element of the application to be implemented. On the right of the module, a supporting plate with flange (19) but without any thermo-photovoltaic cell on it, is connected and bonded to the wires (5) of the rightmost supporting plate (19) containing thermo-photovoltaic cells (1). The supporting plate without thermo-photovoltaic cells (1) is a second electrode of the module (24), for example the negative electrode, and may be extended as far as convenient.

In this schematic module only three thermo-photovoltaic cells (1) are shown. Generally a real module will have more thermo-photovoltaic cells (1), until a convenient voltage is achieved between its electrodes, for example a few tens of volts, or even more. In an embodiment the module comprises two thermo-photovoltaic cells (1) in parallel and 60 supporting plates in series, thus resulting in 120 thermo-photovoltaic cells of 6×2 cm$^2$. The total area of thermo-photovoltaic cells in this embodiment would be 120× 12=1440 cm$^2$.

Figure 11:
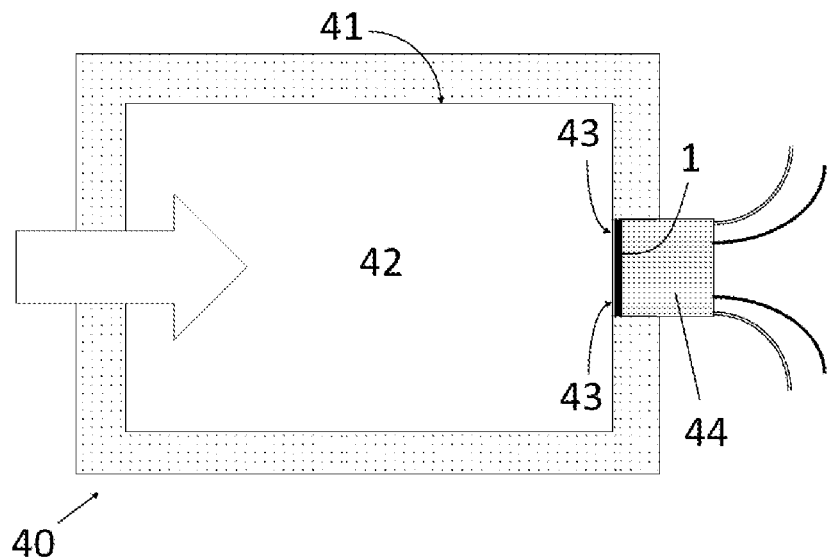
FIG. 11 shows a thermo-photovoltaic system according to an embodiment of the invention.

FIG. 11 shows a thermo-photovoltaic system according to an embodiment of the invention; in particular, an energy storage system (40) comprising a thermo-photovoltaic cell (1) according to the invention and an incandescent cavity (41). The cavity (41) contains an incandescent body or material (42) which emits radiation that remains confined by insulating walls (depicted in FIG. 11 as a dotted area). The wall comprises a window (43) through which the radiation may exit the cavity. The thermo-photovoltaic cell (1) is attached to the window (43) and receives the emitted radiation.

In use, the thermo-photovoltaic cell (1) converts into electric power the isotropic radiation emitted through the window (43) of the cavity (41) and returns to the cavity window (43) a large amount of the unused radiation. A cooling element (44) attached to the thermo-photovoltaic cell (1) transfers to a coolant fluid (e.g. water) the necessary heat to keep the temperature low, thus keeping the thermo-photovoltaic cell (1) at temperature close to the ambient and facilitating the effective operation of the semiconductor plate as a photovoltaic device. The arrow in the figure indicates any method to inject heat into the cavity (41). Electric wires and water pipes are included to extract electric and thermal power, respectively. Although one thermo-photovoltaic cell has been schematically depicted in the figure, a plurality of thermo-photovoltaic cells and/or one or several thermo-photovoltaic modules according to the invention may be attached to the window.

Figure 12:
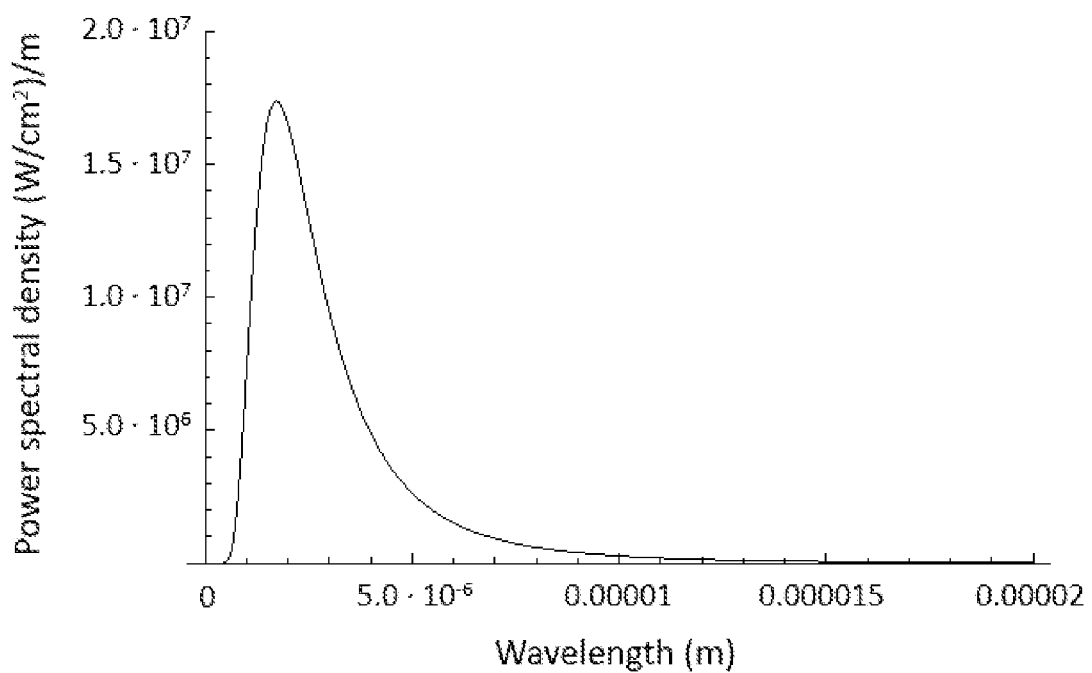
FIG. 12 shows the power spectral density of an incandescent black body at the temperature of the silicon melting point (1410° C. or 1683.15 K) as a function of the wavelength in vacuum. The ordinates are expressed in $(W/cm^2)/m$ and the abscissas in m.

FIG. 12 shows the power spectral density of an incandescent black body at the temperature of the silicon melting point (1410° C. or 1683.15 K) as a function of the wavelength in vacuum. The ordinates are expressed in (W/cm$^2$)/m and the abscissas in m. Its integral is the power density of the emitted radiation, which is 45.51 W/cm$^2$. It is convenient to compare it with the power received from the so-called standard sun, which is 0.1 W/cm$^2$. As seen, it is much bigger, although comparable to the power density received by the present day multijunction concentrator cells. In these, which are usually less than 1 cm$^2$, it is necessary to put a dense contact-finger grid to extract the current to the edge, outside the illuminated area, on which a wide busbar is placed. In the thermo-photovoltaic cell according to the invention, which, in order not to waste radiant energy, is preferably located very close to the incandescent body, it receives the aforementioned power density of the order of 45.51 W/cm$^2$ from the blackbody and there is not side area available for a wide busbar-base strips or for cooling the cell.

But also, under illumination of a black body at the temperature of melting silicon, the radiant power received by the thermo-photovoltaic cell at wavelengths above the absorption threshold of germanium (1.85 µm) is 31.91 W/cm$^2$, which is what must be returned to the incandescent source. Of course not all this radiation can be returned. The method of calculation to determine the thermo-photovoltaic efficiency is described below.

The series resistance of the thermo-photovoltaic cell (1) of the present invention may be calculated as taught in the literature (e.g. Luque, A.: Solar Cells and Optics for Photovoltaic Concentration, Adam Hilger, Bristol (1989), Chap 4). For the case of ordinary concentrator cells, series resistance mainly comprises the series resistance of the lateral path of the current from their generation points to the front contact-finger strips (4), the resistance along the front contact-finger strips (4) to the busbar (situated outside the illuminated spot) and that of the plate (2), front-to-back. In the thermo-photovoltaic cell (1) of the present invention the series resistance of the front busbar-base strip (3) and wire (5), on the one hand, and the lateral path of the current, from their generation points to the back contact-finger strips (7), on the other hand, must be added to the ordinary cell series resistance. In addition to it, in the embodiment with the dielectric mirror (14) the resistance along the back contact-finger strips (7) to the back busbar-base strips (6) must also be added. In the embodiments with the metal mirror the series resistance along the back contact fingers (7) made through the windows (27) is not to be accounted for, because they are directly connected to the back metal layer forming the back contact, whose series resistance is deemed to be zero.

In a preferred rectangular cell embodiment, all these are function of the cell width L, of the average shading under isotropic illumination of the wire (which is the wire diameter for a cylinder) d, of the period of the front busbar wires (distance from center to center) l, of the period of the back busbar strips $l_D$, of the transparency factor of the front contact-finger strips (defined as their width divided by their period) F, and of the transparency factor of the back contact-finger strips $F_b$. All these parameters are to be optimized for maximum thermo-photovoltaic efficiency. There are other dimension parameters which are determined by manufacturing considerations (e.g. the width and thickness of the contact-finger strips and of the busbar-base strips). In other non-rectangular embodiments the series resistance can also be calculated and optimized. In the embodiment with the metal mirror, where there are no back busbar, has no meaning and the terms containing it are zero.

In order to achieve thermo-photovoltaic efficiency optimization it is necessary to consider the radiant power returned to the incandescent source. When the thermo-photovoltaic cell is hemispherically illuminated by the incandescent source, part of the radiant power is reflected by the elements in the front face of the thermo-photovoltaic cell (mostly by the metals, but a small fraction is also reflected by the anti-reflection coating). The reflected radiant power is returned to the incandescent source and the rest of the radiation enters the semiconductor plate (2). The radiation below the transparency threshold is totally absorbed by the semiconductor, mostly producing photocurrent. The radiation above the threshold becomes confined in a cone (if the semiconductor plate has both faces flat) whose angle is the limit angle between the air and the semiconductor; then it is reflected by the mirror and forms another cone of radiation which is returned to the incandescent source. With a high reflectance mirror it may be assumed as a reasonable approximation that the brightness of both cones is the same B (in W/(cm$^2$×stereo-radian)). The forwards radiation cone is slightly absorbed in the semiconductor bulk, in the mirror, in the back contact-finger strips (7) and in the back busbar-base strips (6) despite the pro-reflection layers (if present) that reduce this absorption. On the other hand, the backwards reflected cone suffers the same absorptions in the semiconductor bulk, in the front busbar-base strips (3) and in the front contact-finger strips (4) but most of it exits the thermo-photovoltaic cell (1) by the space uncovered by the front contact grid, although there is a small reflection on the uncovered surfaces, reduced by the anti-reflection coating (11) when present. The radiation leaving the thermo-photovoltaic cell (1) is returned back to the incandescent source.

Thus, there are reflections in all the metallic and dielectric surfaces that the radiation finds in its wandering between the two faces (2.1, 2.2) of the semiconductor plate (2). Most of these reflections are mirror reflections and therefore they are included in the two cones in the semiconductor. They contribute to the brightness B. But some of these reflections produce in particular, in the scattering formed at the edges of the metals and dielectric strips, a small amount of admittedly isotropic radiation which is scattered inside the semiconductor which is treated in a similar form than the cone-restricted radiation, building up an isotropic brightness $B_{iso}$.

The calculation of the brightness B is made by balancing (Luque, A.: The Confinement of Light in Solar-Cells, Solar Energy Materials 23(2-4), 152-163 (1991) or Luque, A.: Coupling Light to Solar Cells, In: Prince, M. (ed.) Advances in Solar Energy. vol. 8, pp. 161-230. ASES, Boulder (Colo.) (1993)) the incoming radiation above the wavelength threshold with the radiation returned to the source plus the described absorption losses. Actually a small part of the radiation is converted into isotropic radiation which is now the input of the brightness $B_{iso}$ and is balanced with the isotropic escaping radiation plus the losses. It has to be taken into account that the escaping radiation is limited to the air-semiconductor limit angle cone and the rest is reflected back, so increasing $B_{iso}$.

What is said allows calculating B and $B_{iso}$ and therefore the radiation returned to the incandescent source, to which the radiation not entering the thermo-photovoltaic cell must be added as well. Therefore, the thermo-photovoltaic efficiency, defined as the quotient of the extractable electrical power divided by the incident radiant power minus the radiant power returned to the radiation source, can be calculated. The variables 1, d, $l_b$ (if it exists), F and $F_b$ can be now selected to yield a maximum in the thermo-photovoltaic efficiency.

In this way the photovoltaic cell may be operated as a dispatchable generator of electricity which converts into electricity under demand the energy stored in a reservoir of molten material with an efficiency which is the thermo-photovoltaic efficiency, much higher (more than 3 times higher, as discussed below) than the ordinary photovoltaic efficiency.

It has been said that several parameters, necessary for the optimization, are selected for easy manufacturing. Each thermo-photovoltaic cell (1) has several busbar-base strips (6) and numerous contact-finger strips (4, 7) on the front and back faces (2.1, 2.2). In general, for the width of all these metallization strips, the narrower the better. For their thickness, the thicker the better, but there are values that are forced by a technology suitable for manufacturing. For width, about 5 μm can be reasonable (given a several cm length), for thickness about 3 μm. In the case of the front busbar strips, they have to accommodate wires of, perhaps, 0.3 mm in diameter on the front face and the channels in the mirror on the back face are limited by the thickness of the saw, say, 50 μm. These considerations also hold, when applicable, for the embodiments having the metallic mirror where no busbar-base strips are present at the back face.

The width L of the thermo-photovoltaic cells (1) greatly influences the series resistance that increases with its increase. An optimization may be performed at the module level by taking into account the gap between thermo-photovoltaic cells when manufacturing the module although this width is usually fixed for practical reasons, 2 cm is a reasonable choice.

As previously explained, the grids have an important role in the losses of the radiation above the absorption threshold that resides inside the semiconductor. Consequently, the thermo-photovoltaic efficiency is optimized as a function of the shadow factors F and $F_b$ for a number of values of the diameter d of the wire on the front face, of their period l and of the back period $l_b$ (if back busbar-base strips are present).

Example 1

In a 0.7 eV semiconductor cell (close to the Ge cell), assumed to follow the Shockley model (Shockley, W.: The Theory of p-n junctions in Semiconductors and p-n Junction Transistors, Bell Syst. Tech. J. 28, 435-489 (1949)), with a grid-free short-circuit current density of 13.53 A/cm$^2$ and an open-circuit voltage of 0.629 V under isotropic illumination of a blackbody at the melting silicon temperature (1410 C), the highest thermo-photovoltaic efficiency, for the embodiment with dielectric mirror, occurs for d=0.3 mm, l=4 mm, $l_b$=1 mm, F=0.038 and $F_b$=0.029. For contact fingers 5 μm wide, their period are 131 and 172 μm on the front and back face respectively. The performance data are 31.8% for the thermo-photovoltaic efficiency, 11.02 A/cm² for the grid-covered short-circuit current density, 0.0127 Ω×cm² for the specific series resistance (series resistance times the cell area) and 95.7% for the reflectance averaged for the useless radiation received by the thermo-photovoltaic cell. The data corresponding to this example are shown in column A of Table 1. The thermo-photovoltaic cell used for the preceding calculations is a thermo-photovoltaic cell that, (ideally) without current collecting grid, achieves a 70% of the thermodynamic efficiency limit of a 0.7 eV cell. The photovoltaic efficiency of this thermo-photovoltaic cell, without counting the radiation returned to the source, is 9.44%. The thermo-photovoltaic efficiency is 3.37 times bigger than the photovoltaic one.

However, digging the back mirror every 1 mm is suspected to be too harmful for the mirror. Thus a period of the channels in the back mirror of 5 mm has been considered more adequate for manufacturing. For $l_b$=5 mm, the highest thermo-photovoltaic efficiency occurs for d=0.3 mm, l=4 mm, F=0.040 and $F_b$=0.075. The period of the contact fingers 5 μm wide is 126 and 66.8 μm on the front and back face respectively. The performance data are 29.4% for the thermo-photovoltaic efficiency, 11.00 A/cm² for the grid-covered short-circuit current density, 0.0138 Ω×cm² for the specific series resistance and 94.7% for the reflectance averaged for the useless radiation received by the cell. The photovoltaic efficiency of this thermo-photovoltaic cell is 9.16%. The thermo-photovoltaic efficiency is 3.18 times bigger than the photovoltaic. The data corresponding to this example are shown in column B of Table 1.

The optimal thermo-photovoltaic efficiency using the embodiment with silver mirror, for the same 0.7 eV solar cells under the same radiation source occurs for d=0.3 mm, l=4 mm, F=0.039 and $F_b$=0.028. For contact fingers 5 μm wide, their period is 128 and 176 μm on the front and back face respectively. The performance data are 30.4% for the thermo-photovoltaic efficiency, 11.01 A/cm² for the grid-covered short-circuit current density, 0.0125 Ω×cm² for the specific series resistance (series resistance times the cell area) and 94.5% for the reflectance averaged for the useless radiation received by the cell. The photovoltaic efficiency of this cell is 9.56%. The thermo-photovoltaic efficiency is 3.18 times greater than the photovoltaic. Note that the thermo-photovoltaic efficiency, 30.4%, is lower than the optimal value of the embodiment with dielectric mirror, 31.8%, but higher than the value considered practical for dielectric mirror, 29.4%. Furthermore, the silver mirror embodiment is simpler. Anyway the variation of the performances is in all cases rather small. The data corresponding to this example are shown in column C of Table 1.

A preferred embodiment for a module with Ge cells has already been briefly presented. It can be almost the same for any 0.7 eV semiconductor. This module has 2 cells in parallel in supporting plates (19), 60 plates in series comprising 120 cells of 6×2 cm². The total cell area is about 120×12=1440 cm². The module characteristics are open-circuit voltage, 37.7 V; short-circuit current, 246 A; length 120 cm, width 12 cm, power 6.028 kW (with the practical digging of the back mirror). Other embodiments are possible, for instance modules with ½, ⅓ and ¼ of this module length with the same current and ½, ⅓ and ¼ the voltage and power. There are many other combinations possible using the same cells, and different cell size may also be used. All these combinations are covered by this disclosure.

Concerning the cooling of the module, the 6.028 kW module receives, in addition to the useless radiation, 10 W/cm² of heat that has to be dissipated, in addition to the electric power output. If it is cooled with water at a rate of 5 liters per minute, a balance of heat yields that the water temperature at the exit is 40.27° C. over the incoming water temperature. The cells will be at about half of this temperature. Everything is very reasonable and water heat exchangers with these requirements are easy to find. This conclusion is also applicable to most of the modules with other output power.

Example 2

It has already been pointed out the commercial interest in using silicon cells. From a conceptual point of view nothing is different but the results are very dissimilar. To start with, the wavelength threshold for useless radiation is 1.0 μm (instead of 1.85-1.77 μm for Ge-0.7 eV semiconductor respectively). The first consequence is that the useless radiation received from the melting Si blackbody (1410° C.) is 44.13 W/cm² to compare with the 33.11 W/cm² for the 0.7 eV cell. Very small fraction of the incoming radiation— 1.38 W/cm²— is therefore useful for photocurrent. Of course, in both cases the input radiation power is 45.51 W/cm². The cell we have used here simulates a good commercial Si cell assumed to follow the Shockley model (Shockley, W.: The Theory of p-n junctions in Semiconductors and p-n Junction Transistors, Bell Syst. Tech. J. 28, 435-489 (1949).) with a grid-free short-circuit current density of 0.855 A/cm² and an open-circuit voltage of 0.774 V under isotropic illumination of a blackbody at the melting silicon temperature (1410° C.). Using the dielectric mirror embodiment, the highest thermo-photovoltaic efficiency occurs for d=70 μm, available for wire-bonding in microelectronics, l=5 mm, $l_b$=3 mm, F=0.00548 and $F_b$=0.00500. The period between contact fingers 5 μm wide is 0.92 mm and 1.00 mm on the front and back face respectively. The performance data are 27.9% for the thermo-photovoltaic efficiency, 0.826 A/cm² for the grid-covered short circuit current density, 0.0854 Ω×cm² for the specific series resistance and 99.1% for the reflectance averaged for the useless radiation received by the cell. The data corresponding to this example are shown in column D of Table 1.

However, as above, digging the back mirror every 3 mm is suspected to be too harmful for the mirror. Thus a period of the channels in the back mirror of 5 mm has been considered more adequate to manufacturing. The highest thermo-photovoltaic efficiency for $l_b$=5 mm occurs for d=80 μm, l=6 mm, F=0.00598 and $F_b$=0.00608. The period of the contact fingers 5 μm wide is 0.86 and 0.82 mm on the front and back faces respectively. The performance data are 27.6% for the thermo-photovoltaic efficiency, 0.827 A/cm² for the grid-covered short-circuit current density, 0.0953 Ω×cm² for the specific series resistance and 99.1% for the reflectance averaged for the useless radiation received by the cell. The data corresponding to this example are shown in column E of Table 1.

The photovoltaic efficiency of this cell (without returning radiation) is 1.13%. In this case the thermo-photovoltaic efficiency is 24.4 times greater than the photovoltaic. This reflects the fact that the silicon cells are very bad adapted to the molten silicon radiation. Most of the received radiation is useless and must be returned back, this explaining the high reflectance, but without returning radiation back the efficiency is very low. Anyway the use of very high performance mirrors makes possible to use the silicon cells, and in general, photovoltaic cells poorly adapted spectrally to the incandescent source, as thermo-photovoltaic cells.

For cells of 6×2 cm², a preferred module embodiment for the Si cells is formed by an array of 20 cells in parallel on the same plate and 40 plates in series. The size of this module is 120×80=9600 cm² and the electrical data are: open-circuit voltage, 29.8 V; short-circuit current, 198 A; nominal power 4.658 kW.

The cooling of this module has not been accurately calculated but from its characteristics it can be deduced that the heat to dissipate is about 10 times less than in the module of 0.7 eV semiconductor cells. This means that probably a natural-convection set of cooling fins in the module rear are sufficient for a reasonable heat removal. If not, forced air on the fins will certainly do the job.

It is evident that this example is very different form the one with cells of 0.7 eV semiconductors. The first consideration is the size, more than one order of magnitude bigger, with the Si cells, for the same power. But the cooling is simpler and the thermo-photovoltaic efficiency is only slight lower for the Si cells. Thus, this option may be preferable if the price of the junction-ready Si plates is much lower than for the Ge plates.

In any case it is to be stressed that a large variety of modules may be manufactured with the thermo-photovoltaic cells according to the invention.

TABLE 1

| Parameter | A | B | C | D | E |
|---|---|---|---|---|---|
| Cell width (cm) | 2 | 2 | 2 | 2 | 2 |
| Front busbar diameter(mm) | 0.3 | 0.3 | 0.3 | 0.070 | 0.080 |
| Front busbars period (mm) | 4 | 4 | 4 | 5 | 6 |
| Back busbars period (mm) | 1 | 5 | — | 3 | 5 |
| Front contact fingers period (μm) | 131 | 126 | 128 | 920 | 860 |
| Back contact fingers period (μm) | 172 | 66.8 | 176 | 1000 | 820 |
| Efficiency (%) | 31.8 | 29.4 | 30.4 | 27.9 | 27.6 |
| Grid-covered current density (A/cm²) | 11.02 | 11.0 | 11.0 | 0.826 | 0.827 |
| Specific series resistance (Ω · cm²) | 0.0127 | 0.0138 | 0.0125 | 0.0854 | 0.0953 |
| Reflectance (%) | 95.7 | 94.7 | 94.5 | 99.1 | 99.1 |

The invention claimed is:

1. A thermo-photovoltaic cell capable of converting into electric power the radiant power emitted by an incandescent source and of returning to the incandescent source a large amount of the unused radiation, the thermo-photovoltaic cell comprising:
    a semiconductor plate having a front face and a back face, the semiconductor plate comprising at least one pn junction or one np junction or one heterojunction,
    a plurality of front contact-finger strips placed on the front face, the front contact-finger strips being electrically conductive and making electrical contact with the front face of the semiconductor plate,
    a plurality of electrically conductive front busbar-base strips placed on the front face and a plurality of electrically conductive wires, each electrically conductive wire being placed on a corresponding front busbar-base strip and electrically contacting with it, the front busbar-base strips and the electrically conductive wires intersecting the front contact-finger strips, wherein the plurality of front contact-finger strips makes electrical contact with the front busbar-base strips,
    a plurality of front pro-reflection strips, each front pro-reflection strip comprising at least one dielectric layer and being arranged between the front face and a front busbar-base strip, the front pro-reflection strips electrically insulating the front busbar-base strips from the semiconductor plate, and
    an electrically conductive layer, arranged at the back face, wherein the electrically conductive layer and the back face make electrical contact only at localized electrically conductive strips, either directly or through an intermediate electrically conductive material.

2. The thermo-photovoltaic cell according to claim 1, further comprising:
    a mirror, located between the back face and the electrically conductive layer, wherein the localized electrically conductive strips are embodied as:
    at least one back busbar-base strip arranged between the back face and the mirror, and
    a plurality of back contact-finger strips arranged between the back face and the mirror, the back contact-finger strips being arranged intersecting at least one back busbar-base strip and making electrical contact with said back busbar-base strip and with the back face of the semiconductor plate,
    and wherein the mirror comprises at least one channel placed over the at least one back busbar-base strip, the at least one channel being filled with an intermediate electrically conductive material to conform an electric contact between the back busbar-base strip and the electrically conductive layer.

3. The thermo-photovoltaic cell according to claim 2, wherein the mirror comprises a plurality of dielectric layers, a photonic crystal, or a combination thereof.

4. The thermo-photovoltaic cell according to any f claim 2, wherein the thermo-photovoltaic cell comprises a plurality of back busbar-base strips, optionally parallel among themselves, and wherein the mirror comprises a plurality of channels placed over the plurality of back busbar-base strips, each channel being filled with the intermediate electrically conductive material to conform an electric contact between a corresponding back busbar-base strip and the electrically conductive layer.

5. The thermo-photovoltaic cell according to claim 2, further comprising
    at least one back pro-reflection strip, the back pro-reflection strip comprising at least one dielectric layer and being arranged between the back face and a back busbar-base strip.

6. The thermo-photovoltaic cell according to claim 5, wherein the back pro-reflection strip has a thickness which maximizes the reflectance between the semiconductor plate and the assembly of the back pro-reflection strip with the back busbar-base strip.

7. The thermo-photovoltaic cell according to claim 2, wherein:
    the front contact-finger strips are substantially parallel one to another, and/or
    the back contact-finger strips are substantially parallel one to another, and/or.

the plurality of front busbar-base strips are parallel among themselves.

8. The thermo-photovoltaic cell according to claim 1, further comprising a back pro-reflection layer arranged between the back face and the electrically conductive layer, wherein the localized electrically conductive strips are embodied as a plurality of windows arranged in the back pro-reflection layer and filled with the material of the electrically conductive layer to conform a plurality of back contact-finger strips which provide electric contact between the back face and the electrically conductive layer.

9. The thermo-photovoltaic cell according to claim 8, wherein the back pro-reflection layer has a thickness which maximizes the reflectance between the semiconductor plate and the assembly of the back pro-reflection layer with the electrically conductive layer.

10. The thermo-photovoltaic cell according to claim 1, further comprising an anti-reflection coating placed on the front face, everywhere or excluding a region of the front face which is covered by front busbar-base strips.

11. The thermo-photovoltaic cell according to claim 1, wherein the electrically conductive wires are three dimensional, wherein optionally the electrically conductive wires have a cross section area of at least 3000 times the cross section area of the front contact-finger strips.

12. The thermo-photovoltaic cell according to claim 1, wherein the front face and/or the back face of the semiconductor plate are mirror polished.

13. A module comprising a thermo-photovoltaic cell according to claim 1.

14. The module according to claim 13, wherein the module comprises a plurality of thermo-photovoltaic cells, a first end holder, a second end holder and at least one intermediate holder;
wherein the first end holder, the second end holder and the intermediate holders are electrically conductive;
wherein the thermo-photovoltaic cells are placed on and attached to the first end holder and the intermediate holders;
wherein the intermediate holders and the second end holder comprise a flange at one end, the flange comprising a plurality of notches aligned to the front busbar-base strips of the thermo-photovoltaic cells;
wherein the first end holder comprises an elongated portion configured as a first external connection;
wherein the second end holder is intended to act as a second external connection;
wherein the electrically conductive wires are arranged along the notches of the holders, such that the electrically conductive wires of the thermo-photovoltaic cells placed on a holder are connected to the flange of an adjacent holder.

15. The module according to claim 14, further comprising a cooling element attached to the holders.

16. An energy storage system comprising at least one thermo-photovoltaic cell according to claim 1, and an incandescent cavity configured to contain an incandescent material inside; wherein the incandescent cavity comprises a wall having a window and the thermo-photovoltaic cell is attached to the window.

17. The thermo-photovoltaic cell according to claim 1, wherein the front pro-reflection strips have a thickness which maximizes the reflectance between the semiconductor plate and the assembly of the front pro-reflection strips with the front busbar-base strip.

18. A method of manufacturing a thermo-photovoltaic cell according to claim 1, comprising the following steps:

a) providing a semiconductor plate, the semiconductor plate having a front face and a back face and comprising at least one pn junction or one np junction or one heterojunction, b) processing the front face, wherein the processing of the front face comprises the following steps:
depositing on the front face a plurality of front pro-reflection strips, each front pro-reflection strip comprising at least one dielectric layer,
depositing on the front face a plurality of front busbar-base strips, each front busbar-base strip being electrically conductive, and each front busbar-base strip being deposited on a corresponding front pro-reflection strip,
depositing a plurality of front contact-finger strips on the front face, intersecting a plurality of front busbar-base strips and making electrical contact with said front busbar-base strips and with the semiconductor plate, the plurality of front contact-finger strips being made of electrically conductive material,
placing a plurality of electrically conductive wires each electrically conductive wire being placed on a corresponding front busbar-base strip, c) processing the back face, wherein the processing of the back face comprises the following steps:
depositing an electrically conductive layer at said back face.

19. The method of manufacturing a thermo-photovoltaic cell according to claim 18, wherein step c) comprises:
prior to providing the electrically conductive layer, depositing on the back face at least one back busbar-base strip, the back busbar strip being electrically conductive,
depositing a plurality of back contact-finger strips intersecting the at least the one back busbar-base strip and making electrical contact with the back busbar-base strip and with the semiconductor plate, the back contact-finger strips being made of electrically conductive material,
providing a mirror by depositing a plurality of dielectric layers and covering the back contact-finger strips and the at least one back busbar-base strip,
digging in the mirror at least one channel placed over the at least one back busbar-base strip,
filling the at least one channel with an intermediate electrically conductive material, and
covering the mirror with the electrically conductive layer,
wherein the intermediate electrically conductive material within the at least one filled channel conforms an electric contact between the back busbar-base strips and the electrically conductive layer.

20. The method of manufacturing a thermo-photovoltaic cell according to claim 19, the method further comprising:
prior to depositing the at least one back busbar-base strip, depositing on the back face at least one back pro-reflection strip, the back pro-reflection strip comprising at least one dielectric layer, and the at least one back busbar-base strip being deposited on the back pro-reflection strip.

21. The method of manufacturing a thermo-photovoltaic cell according to claim 18, wherein step c) comprises:
prior to providing the electrically conductive layer, depositing a back pro-reflection layer covering the whole back face,
perforating the back pro-reflection layer to form a plurality of windows, and
providing the electrically conductive layer by depositing a metal layer on the back of the pro-reflection layer, the material of the electrically conductive layer going through the plurality of windows to conform an electric contact between the back face and the electrically conductive layer.

22. The method of manufacturing a thermo-photovoltaic cell according to claim 18, the method further comprising depositing an anti-reflection coating on the front face, optionally on a region of the front face which is not covered by the front busbar-base strips, said anti-reflection coating being optionally formed by at least one layer of dielectric material.

* * * * *